US012813220B2

(12) United States Patent
Sugatani et al.

(10) Patent No.: US 12,813,220 B2
(45) Date of Patent: Nov. 24, 2026

(54) SEMICONDUCTOR APPARATUS AND MANUFACTURING METHOD USING SINTERED METAL PASTE PATTERNS

(71) Applicants: ADVANTEST CORPORATION, Tokyo (JP); TOKYO INSTITUTE OF TECHNOLOGY, Tokyo (JP)

(72) Inventors: Shinji Sugatani, Saitama (JP); Masaki Takakuwa, Saitama (JP); Shuji Uehara, Gunma (JP); Takayuki Ohba, Kanagawa (JP)

(73) Assignee: ADVANTEST CORPORATION, Tokyo (JP)

( * ) Notice: Subject to any disclaimer, the term of this patent is extended or adjusted under 35 U.S.C. 154(b) by 438 days.

(21) Appl. No.: 18/481,203

(22) Filed: Oct. 4, 2023

(65) Prior Publication Data

US 2024/0290741 A1 Aug. 29, 2024

(30) Foreign Application Priority Data

Feb. 24, 2023 (JP) ................................ 2023-027304

(51) Int. Cl.
*H10P 72/70* (2026.01)
*H10W 70/68* (2026.01)
(Continued)

(52) U.S. Cl.
CPC .......... *H10P 72/74* (2026.01); *H10P 72/7432* (2026.01); *H10W 70/681* (2026.01);
(Continued)

(58) Field of Classification Search
CPC ............ H10P 72/74; H10W 72/01323; H10W 72/07331; H10W 70/681
(Continued)

(56) References Cited

U.S. PATENT DOCUMENTS 6,239,488 B1 5/2001 Chen
2004/0217455 A1 11/2004 Shiono
(Continued)

FOREIGN PATENT DOCUMENTS

JP 2000252235 A 9/2000
JP 2011216772 A 10/2011
(Continued)

OTHER PUBLICATIONS

Office Action issued for counterpart Taiwanese Application 112142426, transmitted from the Taiwan Intellectual Property Office on Mar. 19, 2024 (issued on Mar. 14, 2024).
(Continued)

*Primary Examiner* — Jami Valentine Miller

(57) ABSTRACT

A manufacturing method of a semiconductor apparatus in which a semiconductor chip is joined to a target object, the manufacturing method including forming, in a joining region between the semiconductor chip and the target object where the semiconductor chip and the target object should be joined to each other, a plurality of metal paste patterns with a gap being provided in at least a part along a thickness direction between one another, and joining the semiconductor chip and the target object by sintering the plurality of metal paste patterns sandwiched between the semiconductor chip and the target object in a state where the gap exists between one another.

12 Claims, 29 Drawing Sheets

(51) Int. Cl.

| | |
|---|---|
| *H10W 72/00* | (2026.01) |
| *H10W 72/30* | (2026.01) |
| *H10W 90/00* | (2026.01) |

(52) U.S. Cl.

CPC .. *H10W 72/01323* (2026.01); *H10W 72/0198* (2026.01); *H10W 72/07331* (2026.01); *H10W 72/327* (2026.01); *H10W 90/734* (2026.01)

(58) Field of Classification Search

USPC ........................................................ 257/734

See application file for complete search history.

(56) References Cited

U.S. PATENT DOCUMENTS

| | | | | |
|---|---|---|---|---|
| 2014/0361445 | A1* | 12/2014 | Nashida | H05K 3/32 257/782 |
| 2018/0005847 | A1* | 1/2018 | Fagan | H10P 72/722 |
| 2018/0102341 | A1 | 4/2018 | Konno | |
| 2018/0248051 | A1 | 8/2018 | Taiki | |
| 2018/0257142 | A1* | 9/2018 | Kamakura | B22F 7/08 |
| 2018/0273808 | A1* | 9/2018 | Kamakura | C08K 3/08 |
| 2020/0048504 | A1* | 2/2020 | Sugo | B22F 7/064 |
| 2020/0273596 | A1* | 8/2020 | Mori | B22F 7/08 |
| 2020/0276645 | A1* | 9/2020 | Ichikawa | B22F 7/064 |
| 2020/0277515 | A1* | 9/2020 | Ichikawa | H10P 72/7402 |
| 2021/0078080 | A1* | 3/2021 | Mori | H10W 70/417 |
| 2021/0098418 | A1* | 4/2021 | Mita | H10P 54/00 |
| 2021/0138541 | A1* | 5/2021 | Anai | B22F 7/064 |
| 2021/0193523 | A1* | 6/2021 | Mita | H10P 54/00 |
| 2022/0380639 | A1* | 12/2022 | Anai | C09J 5/00 |
| 2024/0321705 | A1* | 9/2024 | Sakairi | H10W 70/635 |

FOREIGN PATENT DOCUMENTS

| | | | |
|---|---|---|---|
| JP | 2017139345 | A | 8/2017 |
| JP | 2018142680 | A | 9/2018 |
| JP | 2020044480 | A | 3/2020 |
| JP | 2020155498 | A | 9/2020 |
| JP | 2021019038 | A | 2/2021 |
| TW | I224382 | B | 11/2004 |

OTHER PUBLICATIONS

Office Action issued for counterpart Japanese Application No. 2023-027304, transmitted from the Japanese Patent Office on Jul. 21, 2026 (drafted on Jul. 16, 2026) .

* cited by examiner

SEMICONDUCTOR APPARATUS AND MANUFACTURING METHOD USING SINTERED METAL PASTE PATTERNS

The contents of the following patent application(s) are incorporated herein by reference:
NO. 2023-027304 filed in JP on Feb. 24, 2023

TECHNICAL FIELD

The present invention relates to a semiconductor apparatus and a manufacturing method.

BACKGROUND

Patent document 1 describes, "since the percentage of voids is large in a circumference of a joining layer 104a opposing a semiconductor device 101 and in a joining layer 104b positioned in a peripheral part on the rear surface side of an insulated circuit board, at the time of heat treatment for joining the insulated circuit board and a heat dissipating board 105, a volatile substance from a metal paste for joining is easily released to the outside of the joining layers, or the joining layers are easily and sufficiently exposed to a reducing atmosphere" (paragraph 0029).

Patent document 2 describes, "a joining material 3 is formed on a front surface of a substrate 2 by screen printing using a metal particle containing paste. As the metal particle containing paste, for example, an Ag nano-paste manufactured by Cookson Electronics of a sintering type (manufactured by Cookson Electronics: SP2000) can be used" (paragraph 0012).

Patent document 3 describes, "a metal mask where a stainless plate of a 200 μm thickness has an opening of 6×6 mm square is placed on a semiconductor device mounting surface of a lead frame (TO247), and the copper paste for sintering which was obtained in Process a is coated by stencil printing using a metal squeegee" (paragraph 0087).

PRIOR ART DOCUMENT

Patent Document

Patent Document 1: Japanese Patent Application Publication No. 2017-139345
Patent Document 2: Japanese Patent Application Publication No. 2011-216772
Patent Document 3: Japanese Patent Application Publication No. 2021-019038

DESCRIPTION OF EXEMPLARY EMBODIMENTS

Hereinafter, embodiments of the present invention will be described. However, the following embodiments are not for limiting the invention according to the claims. In addition, not all of the combinations of features described in the embodiments are essential to the solution of the invention.

Figure 1:
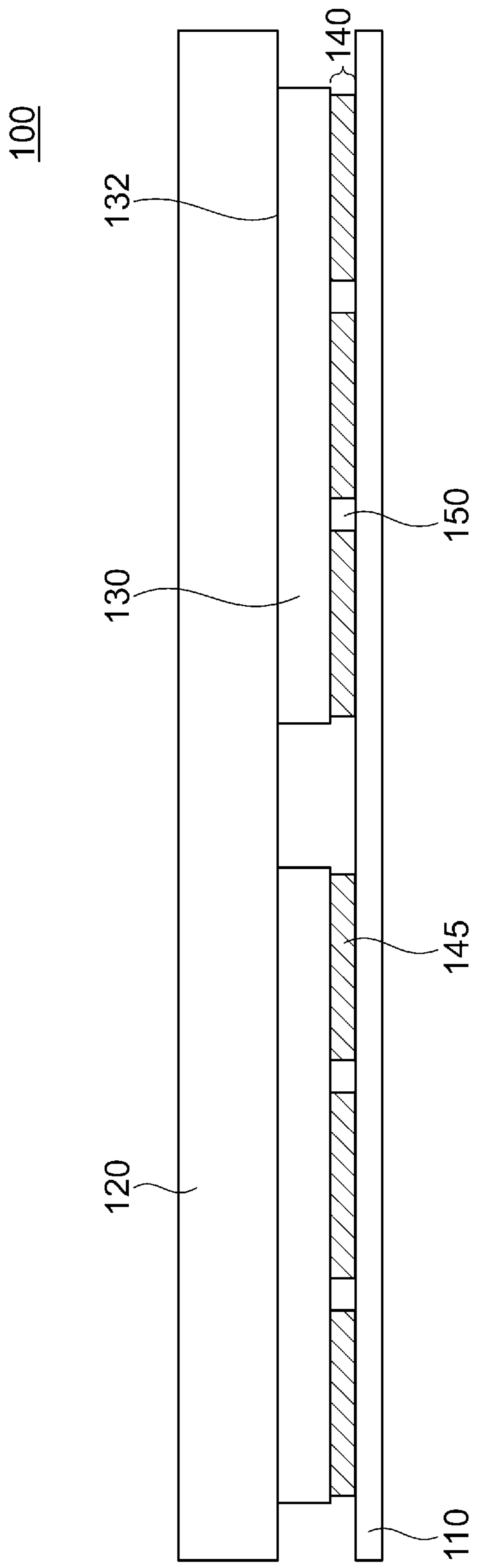
FIG. 1 illustrates a configuration of a semiconductor apparatus 100 according to the present embodiment.

FIG. 1 illustrates a configuration of a semiconductor apparatus 100 according to the present embodiment. Here, the semiconductor apparatus 100 illustrated in the present drawing may be in a form in the middle of manufacturing, or may be in a form of shipment as a product. The semiconductor apparatus 100 includes a target object 110, a supporting substrate 120, one or more semiconductor chips 130, and a joining member 140.

The target object 110 is a component to be the target of joining the semiconductor chip 130. The target object 110 may be a metal plate, a heat radiator, or the like, and it is provided for the purpose of physically fixing the semiconductor chip 130, cooling the semiconductor chip 130, or the like. The target object 110 may be formed of copper or another kind of metal. The target object 110 has a component mounting surface (the topside surface in the present drawing) for mounting each component of the semiconductor apparatus 100 such as the semiconductor chip 130.

The supporting substrate 120 is mounted with the one or more semiconductor chips 130. The supporting substrate 120 has a chip mounting surface (the underside surface in the present drawing) for mounting each component of the semiconductor apparatus 100 such as the semiconductor chip 130.

The semiconductor chip 130 includes a chip substrate, and a circuit pattern 132 which is formed on one surface of the chip substrate. A surface on the opposite side of the surface where the circuit pattern 132 is provided in the semiconductor chip 130 may be electrically insulated against the circuit pattern 132.

The joining member 140 joins the surface on the opposite side of the surface where the circuit pattern 132 is formed in each semiconductor chip 130, to the target object 110. For each semiconductor chip 130, the joining member 140 has a plurality of sintered metal patterns 145 in a joining region between the semiconductor chip 130 and the target object 110 where the semiconductor chip 130 and the target object 110 should be joined to each other. Each sintered metal pattern 145 may be formed by sintering a copper paste, a silver paste, or another kind of metal paste.

The plurality of sintered metal patterns 145 is arranged with a gap 150 being provided in at least a part along a thickness direction between the sintered metal patterns 145 that are next to each other. Regarding the plurality of sintered metal patterns 145, the plurality of sintered metal patterns 145 may be completely separated from one another by providing the gap 150 in the entire thickness direction between the sintered metal patterns 145 that are next to each other. Alternatively, the plurality of sintered metal patterns 145 may have the gap 150 in a part along the thickness direction between the sintered metal patterns 145 that are next to each other, while being connected to one another in the remaining portion of the thickness direction.

FIG. 2A to FIG. 2C, FIG. 3A to FIG. 3C, and FIG. 4A to FIG. 4D illustrate a manufacturing method of the semiconductor apparatus 100 according to the present embodiment. The manufacturing method of the semiconductor apparatus 100 includes a process of forming a metal paste pattern 200 on the target object 110 illustrated in FIG. 2A to FIG. 2C, a process of arranging the semiconductor chip 130 on a supporting substrate 320 illustrated in FIG. 3A to FIG. 3C, and a process of joining the target object 110 and the semiconductor chip 130 by sintering of the metal paste pattern 200 illustrated in FIG. 4A to FIG. 4D.

Figure 2A:
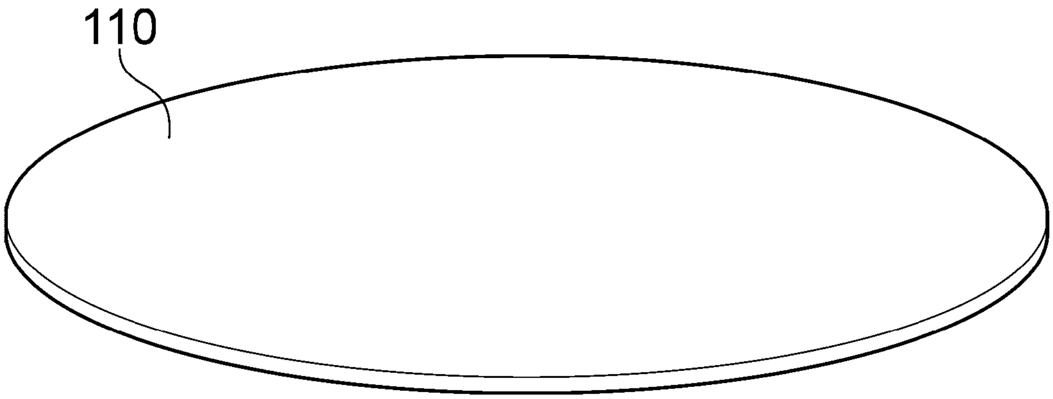
FIG. 2A illustrates preparing a target object 110 in a manufacturing method of the semiconductor apparatus 100 according to the present embodiment.

FIG. 2A illustrates preparing the target object 110 in the manufacturing method of the semiconductor apparatus 100 according to the present embodiment. In the present drawing, the target object 110 is a metal plate having a wafer shape. The target object 110 in the present drawing becomes the target object 110 illustrated in FIG. 1 after the manufacturing of the semiconductor apparatus 100. In this process, surface treatment may be performed on the target object 110 such that a level difference existing on a front surface of the target object 110 becomes 1/10 or less than a thickness of the metal paste pattern 200 to be formed in a later process. In this process, cleaning treatment such as surface oxide removal treatment may be performed on the target object 110.

Figure 2B:
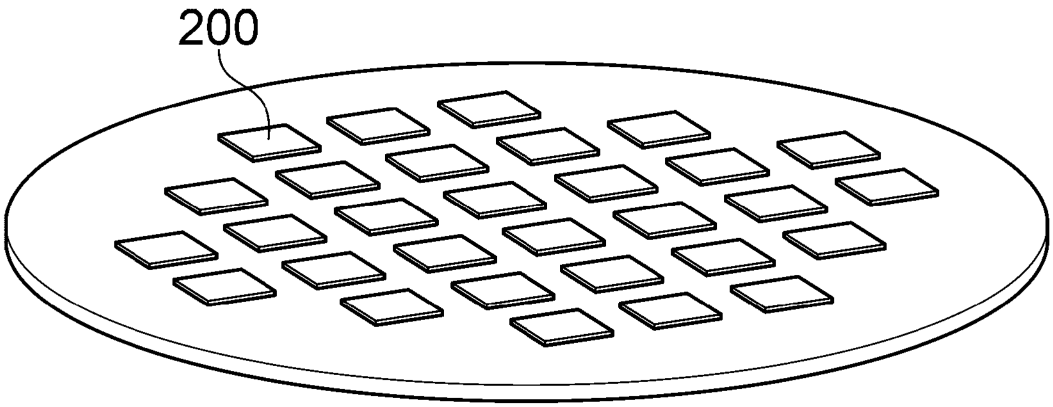
FIG. 2B illustrates forming a metal paste pattern 200 in the manufacturing method of the semiconductor apparatus 100 according to the present embodiment.

FIG. 2B illustrates forming the metal paste pattern 200 in the manufacturing method of the semiconductor apparatus 100 according to the present embodiment. In this process, a plurality of the metal paste patterns 200 is formed correspondingly to individual semiconductor chip 130. Each metal paste pattern 200 may be formed of a copper paste, a silver paste, or another kind of metal paste. Such metal paste may include a solvent. In this process, the metal paste pattern 200 to which the semiconductor chip 130 can be joined later may be formed by arranging the metal paste pattern 200 on the target object 110, and vaporizing a part of the solvent by annealing treatment. In addition, at this time, treatment to improve a joining interface with the metal paste pattern 200 may be performed by coating the front surface of the target object 110 with a metal paste solvent.

Figure 2C:
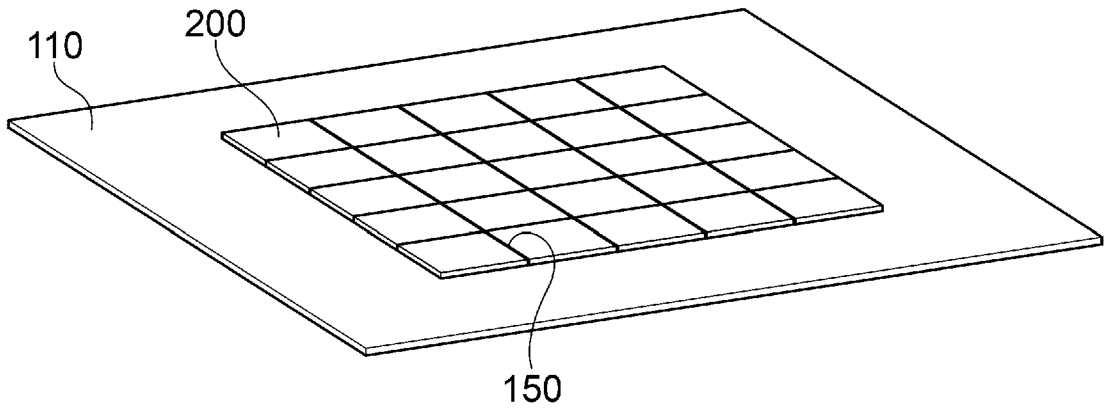
FIG. 2C illustrates an example of a plurality of the metal paste patterns 200 according to the present embodiment formed correspondingly to individual semiconductor chip 130 in FIG. 2B.

FIG. 2C illustrates an example of the plurality of metal paste patterns 200 formed correspondingly to the individual semiconductor chip 130 in FIG. 2B. In FIG. 2B, as illustrated in the present drawing, in a joining region between each semiconductor chip 130 and the target object 110 where each semiconductor chip 130 and the target object 110 should be joined to each other, the plurality of metal paste patterns 200 is formed with the gap 150 being provided in at least a part along a thickness direction between one another.

In the present drawing, the plurality of metal paste patterns 200 formed correspondingly to each semiconductor chip 130 is regularly arranged in a square grid shape. In this manner, the plurality of metal paste patterns 200 may be regularly aligned in a grid shape other than a square (such as a triangular grid, a quadrangular grid, or a hexagonal grid), or the like. Alternatively, the plurality of metal paste patterns 200 may be irregularly aligned.

Individual metal paste pattern 200 may be a thin film having a square shape, a box shape, a triangle shape, a hexagonal shape, a circular shape, or other optional shape. Each of the plurality of metal paste patterns 200 may be in contact with the semiconductor chip 130 and the target object 110 by a sufficiently small area to enable uniform sintering, for example, by a size of 10 mm square or smaller. The contact areas of the plurality of metal paste patterns 200 with respect to the semiconductor chip 130 and the target object 110 may be the same or may be different. A thickness of the plurality of metal paste patterns 200 may be 20 to 100 μm, for example, around 30 μm. The gap 150 between the plurality of metal paste patterns 200 may be 0.5 times or greater and 100 times or smaller of the thickness of each of the plurality of metal paste patterns 200.

Figure 3A:
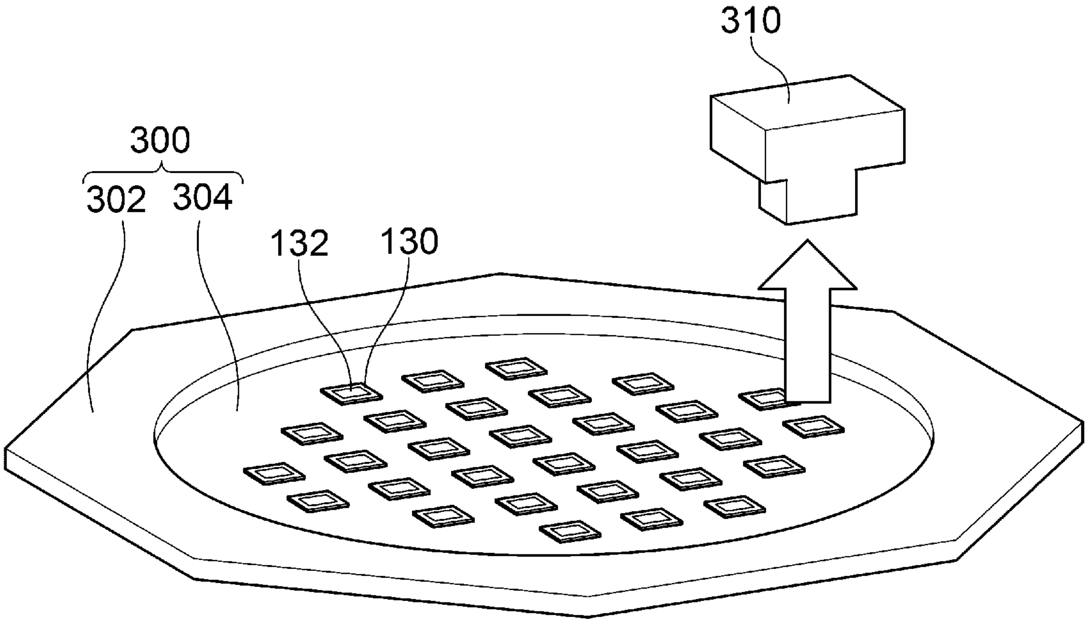
FIG. 3A illustrates preparing the semiconductor chip 130 in the manufacturing method of the semiconductor apparatus 100 according to the present embodiment.

FIG. 3A illustrates preparing the semiconductor chip 130 in the manufacturing method of the semiconductor apparatus 100 according to the present embodiment. In the example of the present drawing, the plurality of semiconductor chips 130 is arranged with intervals between one another on a film frame 300 where a film 304 is fixed to a frame 302, in an orientation in which the circuit pattern 132 of each semiconductor chip 130 faces the topside. Alternatively, the plurality of semiconductor chips 130 may be supplied by being aligned in a chip tray. In this process, a plurality of the singulated semiconductor chips 130 arranged on the film frame 300 is picked up one by one using a picker 310 of a chip handler apparatus or the like, and is handed over to a process illustrated in FIG. 3B.

Figure 3B:
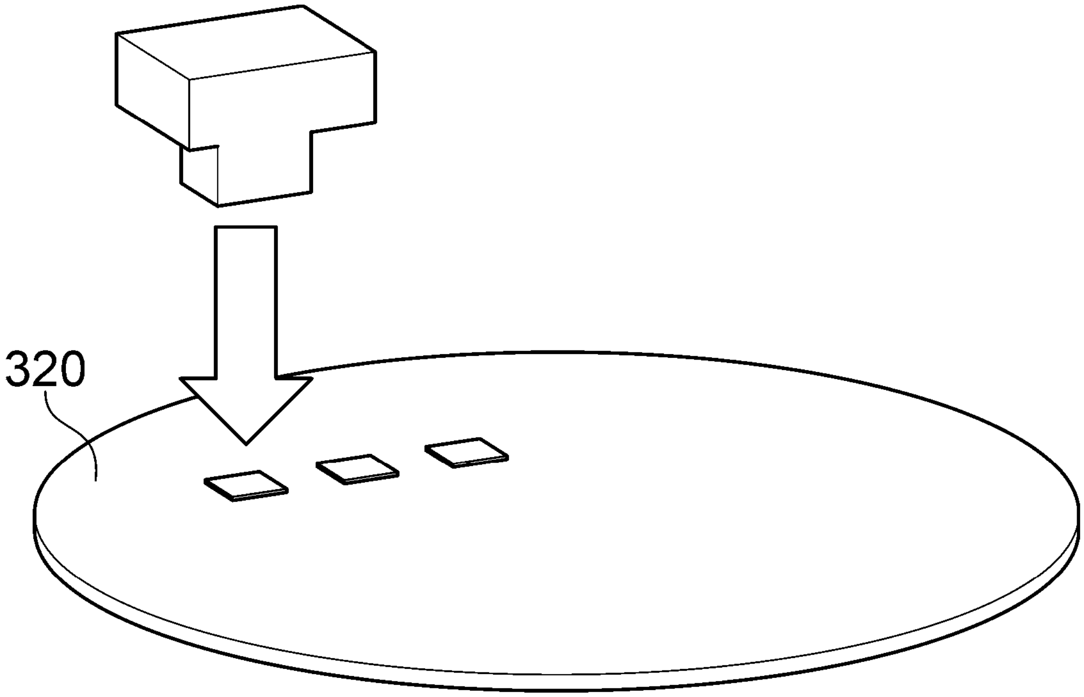
FIG. 3B illustrates arranging the semiconductor chip 130 on a supporting substrate 320 in the manufacturing method of the semiconductor apparatus 100 according to the present embodiment.

FIG. 3B illustrates arranging the semiconductor chip 130 on the supporting substrate 320 in the manufacturing method of the semiconductor apparatus 100 according to the present embodiment. The supporting substrate 320 may have a wafer shape or a rectangular shape. In this process, each semiconductor chip 130 picked up in the process illustrated in FIG. 3A is flipped upside down using the picker 310, and is placed on the supporting substrate 320. In this way, the plurality of semiconductor chips 130 is temporarily fixed to the supporting substrate 320 with the circuit pattern 132 facing the supporting substrate 320 side. The plurality of semiconductor chips 130 is arranged on the supporting substrate 320 at the same intervals as those of the metal paste patterns 200 illustrated in FIG. 2B.

Figure 3C:
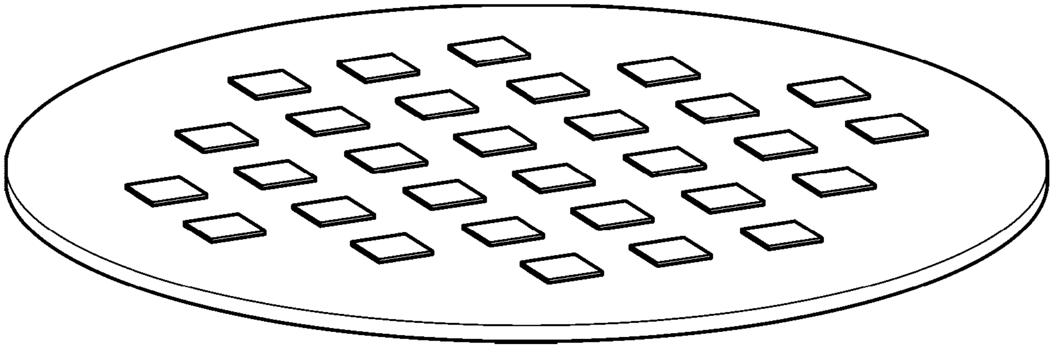
FIG. 3C illustrates the supporting substrate 320 after arranging the semiconductor chip 130, in the manufacturing method of the semiconductor apparatus 100 according to the present embodiment.

FIG. 3C illustrates the supporting substrate 320 after arranging the semiconductor chip 130, in the manufacturing method of the semiconductor apparatus 100 according to the present embodiment. As illustrated in FIG. 3A and FIG. 3B, by realigning the plurality of semiconductor chips 130 from the film frame 300 to the supporting substrate 320, the plurality of semiconductor chips 130 is arranged on the supporting substrate 320 with intervals being provided between one another.

Figure 4A:
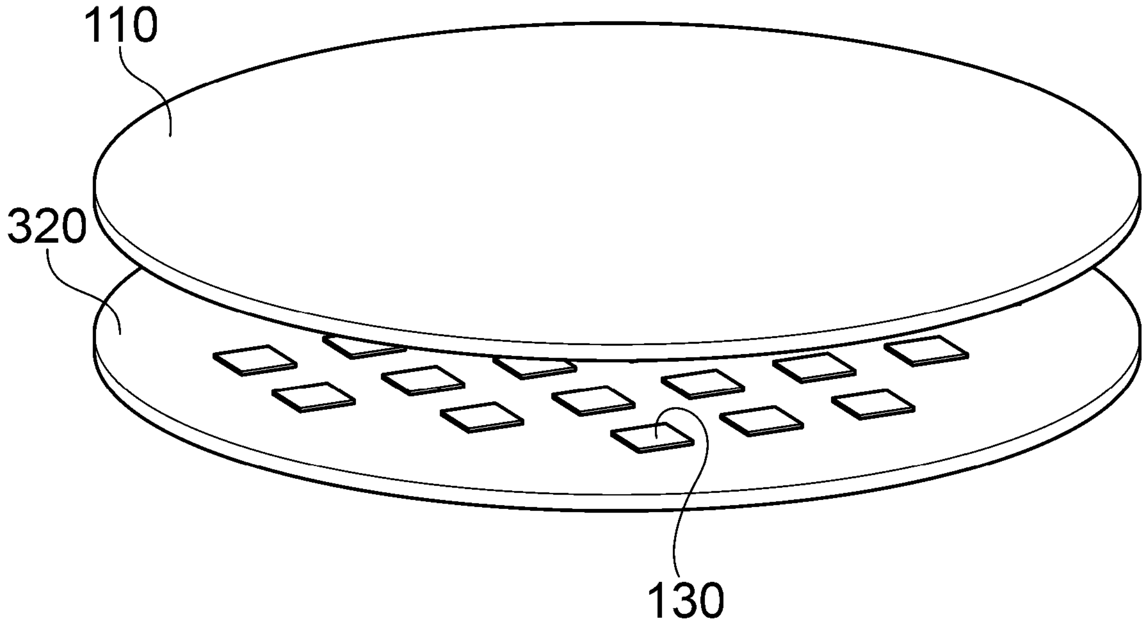
FIG. 4A illustrates temporarily fixing each of a plurality of the semiconductor chips 130 and the target object 110 in the manufacturing method of the semiconductor apparatus 100 according to the present embodiment.

FIG. 4A illustrates temporarily fixing each of the plurality of semiconductor chips 130 and the target object 110 in the manufacturing method of the semiconductor apparatus 100 according to the present embodiment. In this process, the target object 110 where the plurality of metal paste patterns 200 is arranged and the supporting substrate 320 where the plurality of semiconductor chips 130 is arranged are bonded such that the metal paste pattern 200 corresponding to each semiconductor chip 130 is overlapped. At this time, the surface where the circuit pattern 132 is not formed in the semiconductor chip 130 is bonded with the surface where the metal paste pattern 200 is formed in the target object 110.

Figure 4B:
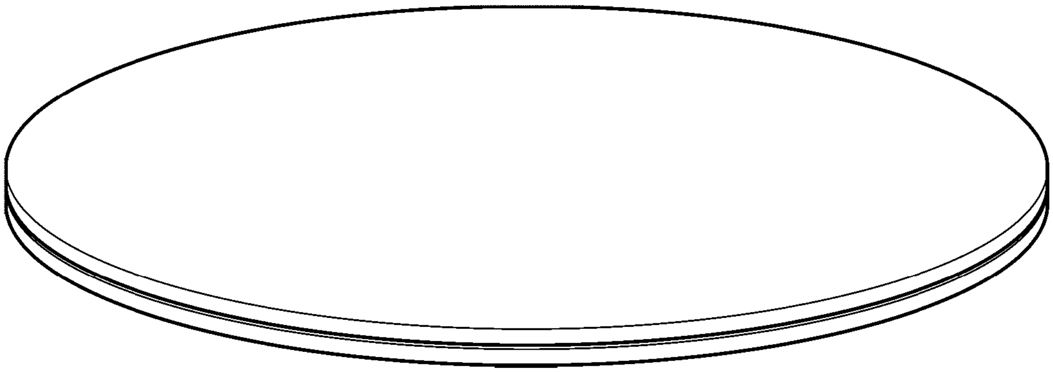
FIG. 4B illustrates joining the semiconductor chip 130 and the target object 110 in the manufacturing method of the semiconductor apparatus 100 according to the present embodiment.

FIG. 4B illustrates joining the semiconductor chip 130 and the target object 110 in the manufacturing method of the semiconductor apparatus 100 according to the present embodiment. In this process, the plurality of semiconductor chips 130 arranged on the supporting substrate 320 is joined to the target object 110 by sintering the plurality of metal paste patterns 200 sandwiched between the plurality of semiconductor chips 130 and the target object 110 in a state where the gap 150 exists between one another. The solvent or the like included in each metal paste pattern 200 volatilizes in the stage of sintering, and goes out in the atmosphere by passing through the gap or the like between the metal paste patterns 200. By the sintering treatment, the plurality of metal paste patterns 200 becomes the plurality of sintered metal patterns 145 joining the semiconductor chip 130 and the target object 110.

Figure 4C:
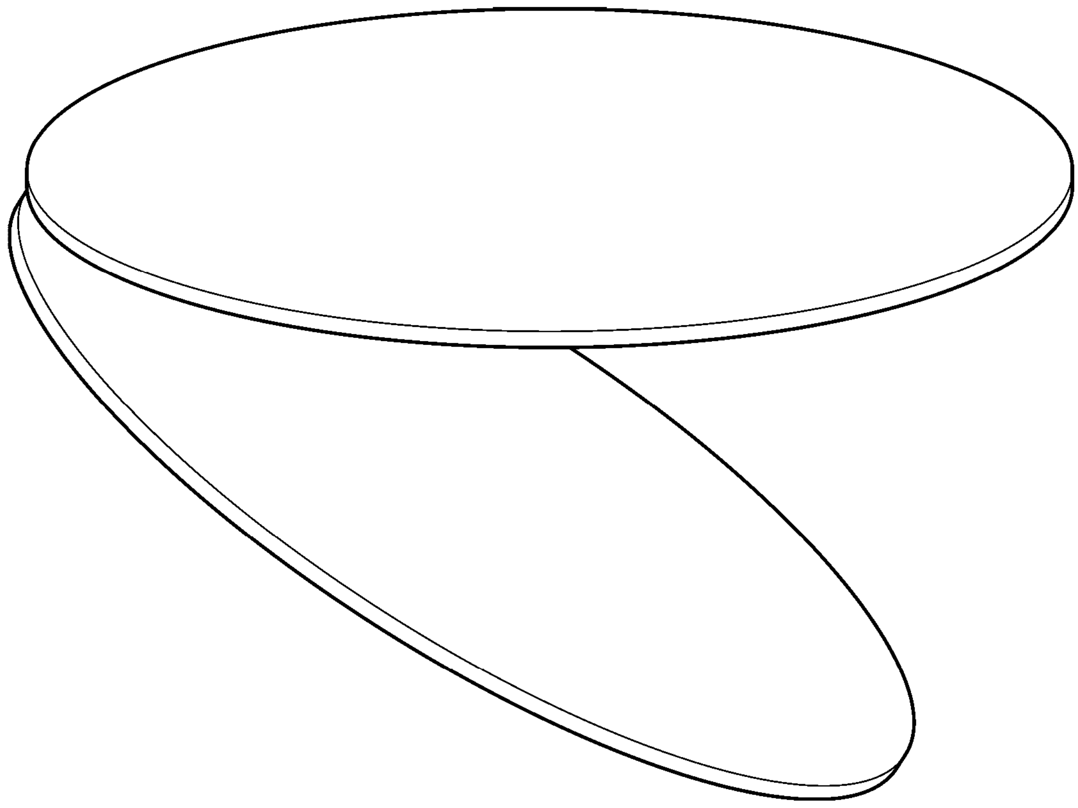
FIG. 4C illustrates delaminating the supporting substrate 320 in the manufacturing method of the semiconductor apparatus 100 according to the present embodiment.

FIG. 4C illustrates delaminating the supporting substrate 320 in the manufacturing method of the semiconductor apparatus 100 according to the present embodiment. In this process, the supporting substrate 320 is delaminated from the plurality of semiconductor chips 130 joined to the target object 110.

Figure 4D:
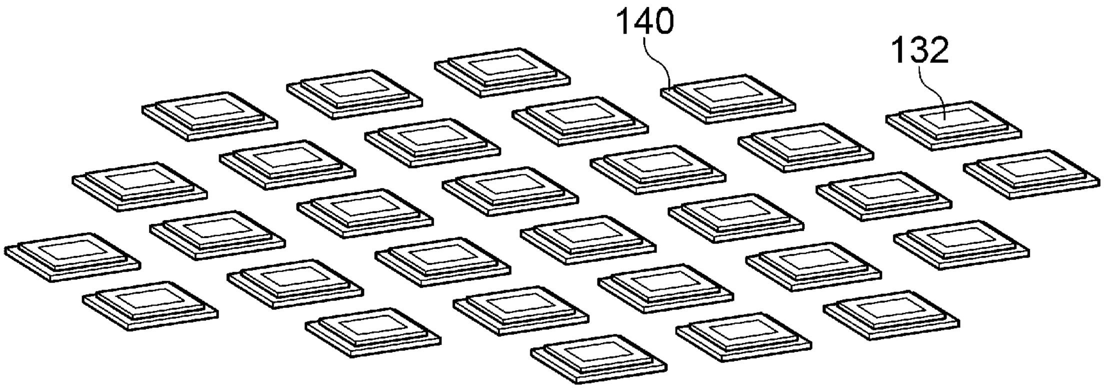
FIG. 4D illustrates singulating the semiconductor apparatus 100 in the manufacturing method of the semiconductor apparatus 100 according to the present embodiment.

FIG. 4D illustrates singulating the semiconductor apparatus 100 in the manufacturing method of the semiconductor apparatus 100 according to the present embodiment. In this process, a plurality of the semiconductor apparatuses 100 is singulated by cutting, at between the plurality of semiconductor chips 130, the target object 110 to which the plurality of semiconductor chips 130 is joined. A method used in the Chip on Wafer (COW) method may be used for the joining of the plurality of semiconductor chips 130 and the supporting substrate 120.

Figure 5:
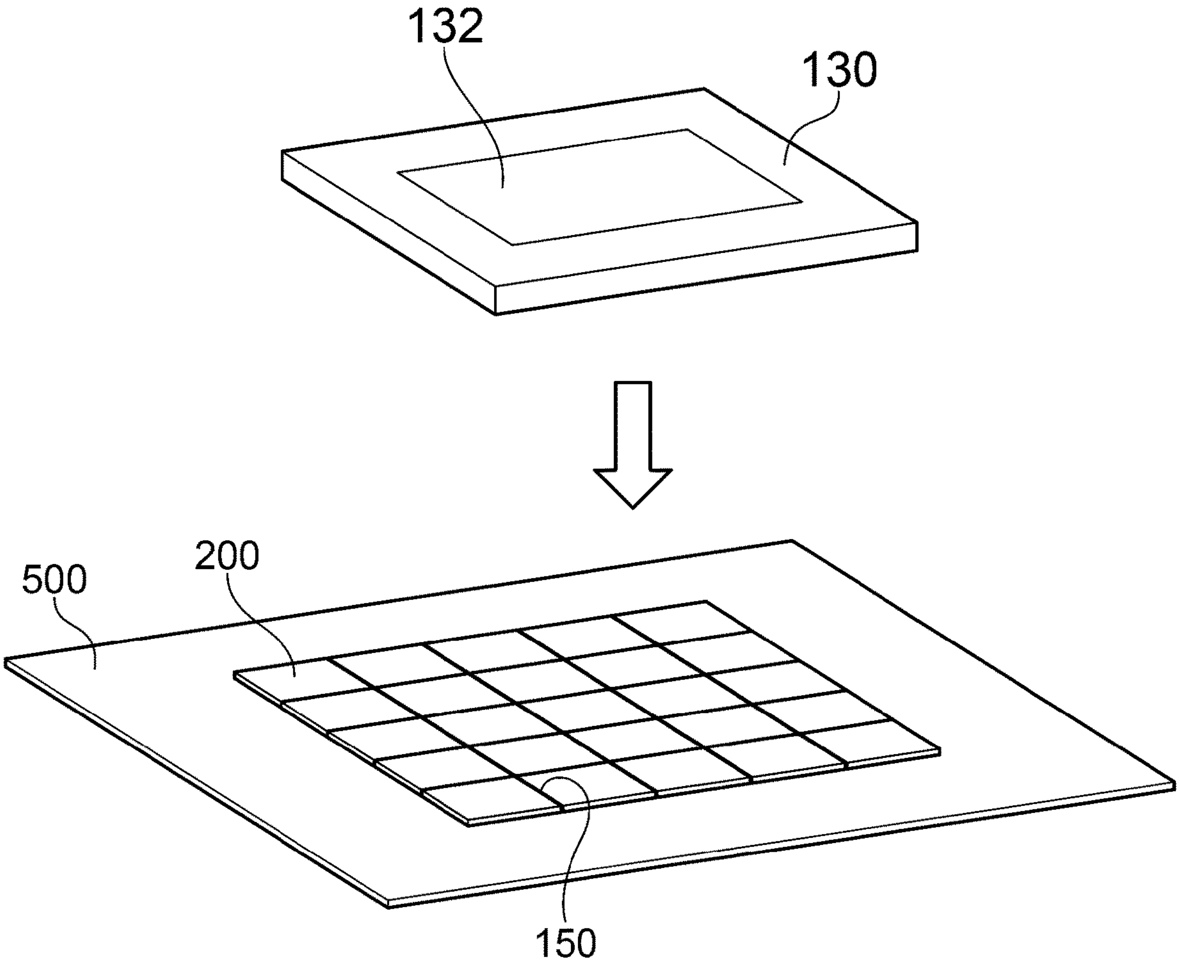
FIG. 5 illustrates a manufacturing method of the semiconductor apparatus 100 according to the present embodiment.

FIG. 5 illustrates a manufacturing method of the semiconductor apparatus 100 according to the present embodiment. Instead of the manufacturing method in which the semiconductor apparatus 100 is singulated after the plurality of semiconductor chips 130 is joined to the target object 110 as illustrated in FIG. 2 to FIG. 4, in the present drawing, one singulated semiconductor chip 130 is installed on a target object 500 where the metal paste pattern 200 is formed. After this, the plurality of metal paste patterns 200 sandwiched between the semiconductor chip 130 and the target object 500 is sintered in the state where the gap 150 exists between one another to join the semiconductor chip 130 and the target object 500, thereby obtaining the semiconductor apparatus 100. In the present drawing, the surface where the circuit pattern 132 is not formed in the semiconductor chip 130 is joined to the surface where the metal paste pattern 200 is formed in the target object 500.

As in these cases, by providing the gap 150 in the metal paste pattern 200, degassing from the metal paste pattern 200 is enabled in an entire joining region even when a larger joining region is joined by using much more metal pastes. Therefore, it is possible to mount the semiconductor chip 130 of a larger size on the semiconductor apparatus 100.

Figure 6:
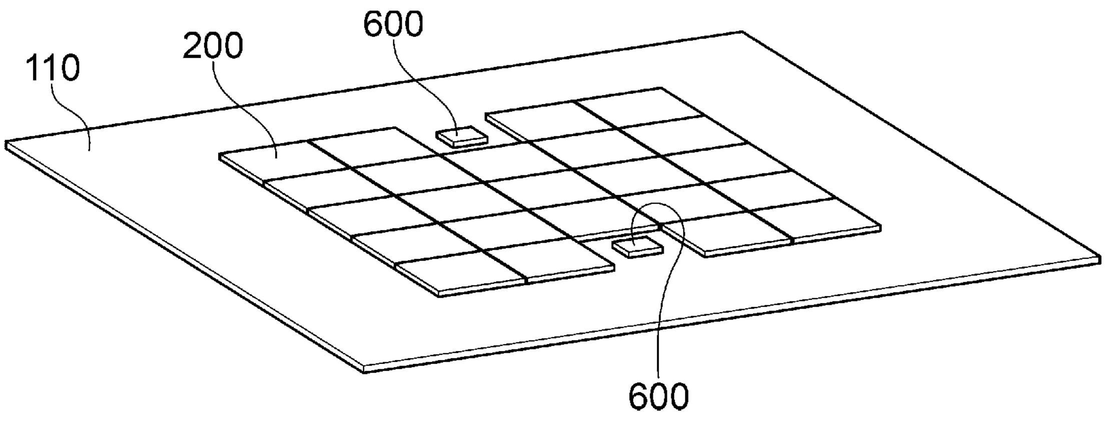
FIG. 6 illustrates a first modification example of the metal paste pattern 200 according to the present embodiment.

FIG. 6 illustrates a first modification example of the metal paste pattern 200 according to the present embodiment. In FIG. 2C, the plurality of metal paste patterns 200 provided for the one semiconductor chip 130 has the same surface shape with one another. Alternatively, at least one metal paste pattern 600 among the plurality of metal paste patterns 200 may have a smaller contact area with respect to the semiconductor chip 130 and the target object 110 as compared to at least one another metal paste pattern 200.

In the present drawing, two metal paste patterns 600 positioned in two edge portions at positions opposing to each other in a joining region have smaller contact areas with respect to the semiconductor chip 130 and the target object 110 as compared to other metal paste patterns 200. In this way, in the sintering illustrated in FIG. 4B and the like, the metal paste patterns 600 which are relatively small are sintered faster than other metal paste patterns 200 which are relatively large. Therefore, since an overlapping position with respect to the semiconductor chip 130 in the target object 110 can be temporarily fixed at an earlier point with a small number of the metal paste patterns 600, and then the semiconductor chip 130 and the target object 110 can be joined with other metal paste patterns 200, it is possible to prevent occurrence of positional displacement between the semiconductor chip 130 and the target object 110 during sintering due to a difference in coefficients of thermal expansion between the semiconductor chip 130 and the target object 110, or the like.

In the example of the present drawing, among the plurality of metal paste patterns 200, at least one metal paste pattern 600 positioned in an edge portion of a joining region has a smaller contact area with respect to the semiconductor chip 130 and the target object 110 as compared to other metal paste patterns 200 that are not positioned in an edge portion of the joining region. In the example of the present drawing, the metal paste patterns 600 are arranged one each in the center of each of two edge portions positioned opposingly to each other in the joining region. However, alternatively, the metal paste patterns 600 may be arranged one each at opposing corners of the joining region. In the example of the present drawing, there are two metal paste patterns 600, however, the metal paste patterns 600 may be provided more than two. For example, in the joining region having a quadrangular shape, four metal paste patterns 600 may be arranged one each at the center of each edge portion, or may be arranged one each at each vertex.

In the semiconductor apparatus 100 manufactured in this manner, at least one sintered metal pattern 145 among the plurality of sintered metal patterns 145 in which the plurality of metal paste patterns 200 and 600 are sintered has a smaller contact area with respect to the semiconductor chip 130 and the target object 110 as compared to at least one another sintered metal pattern 145.

Figure 7:
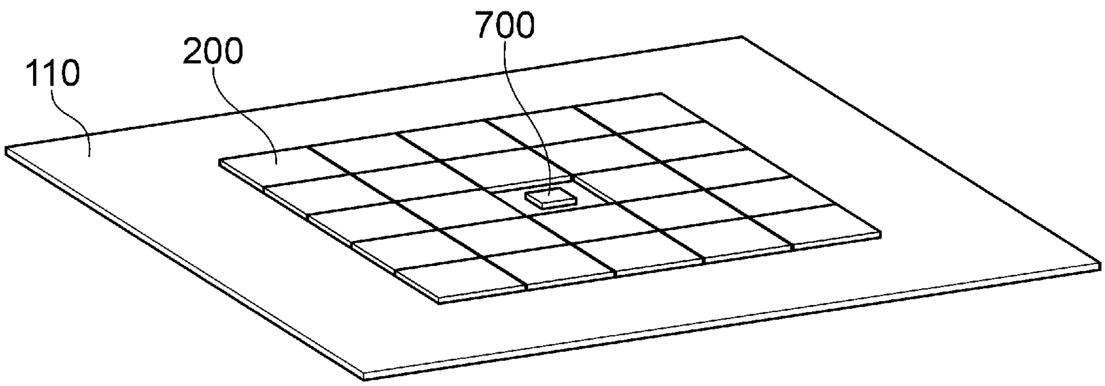
FIG. 7 illustrates a second modification example of the metal paste pattern 200 according to the present embodiment.

FIG. 7 illustrates a second modification example of the metal paste pattern 200 according to the present embodiment. Instead of FIG. 6, in the present drawing, a metal paste pattern 700 positioned in a central part of a joining region has a smaller contact area with respect to the semiconductor chip 130 and the target object 110 as compared to at least one metal paste pattern 200 positioned in an edge portion of the joining region. In this way, in the sintering illustrated in FIG. 4B and the like, the metal paste pattern 700 which is relatively small is sintered faster than other metal paste patterns 200 which are relatively large. Therefore, since an overlapping position with respect to the semiconductor chip 130 in the target object 110 can be temporarily fixed at an earlier point with the metal paste pattern 700, and then the semiconductor chip 130 and the target object 110 can be joined with other metal paste patterns 200, it is possible to prevent occurrence of positional displacement between the semiconductor chip 130 and the target object 110 during sintering due to a difference in coefficients of thermal expansion between the semiconductor chip 130 and the target object 110, or the like.

Figure 8:
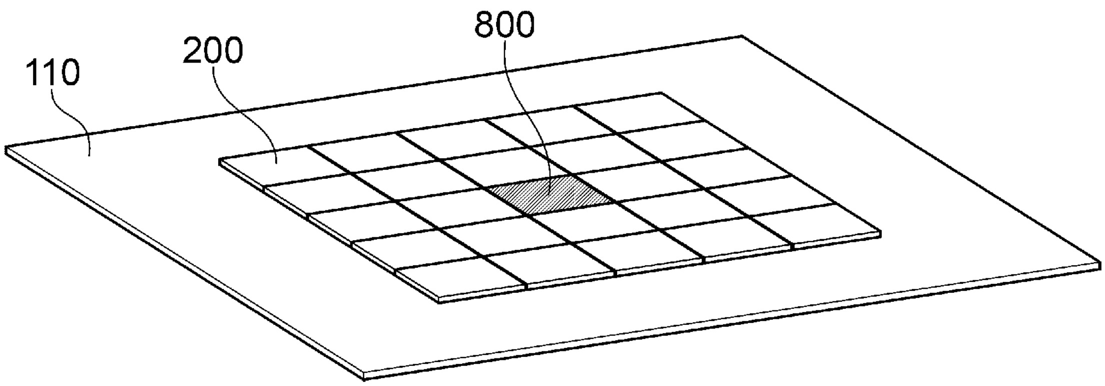
FIG. 8 illustrates a third modification example of the metal paste pattern 200 according to the present embodiment.

FIG. 8 illustrates a third modification example of the metal paste pattern 200 according to the present embodiment. In the present drawing, a metal paste pattern 800 positioned in a central part of a joining region is made of a paste having different sintering conditions (temperature, time, and the like) from those of at least one metal paste pattern 200 positioned in an edge portion of the joining region. For example, the metal paste pattern 200 positioned in an edge portion of the joining region may be made of a Cu paste, and the metal paste pattern 800 positioned in the central part of the joining region may be made of an Ag paste. Alternatively, the metal paste pattern 200 positioned in an edge portion of the joining region and the metal paste pattern 800 positioned in the central part of the joining region may use Cu pastes having different characteristics from each other. In the sintering illustrated in FIG. 4B and the like, the metal paste pattern 800 positioned in the central part of the joining region may be sintered faster as compared to at least one metal paste pattern 200 positioned in an edge portion of the joining region. In this way, since an overlapping position with respect to the semiconductor chip 130 in the target object 110 can be temporarily fixed at an earlier point with the metal paste pattern 800, and then the semiconductor chip 130 and the target object 110 can be joined with other metal paste patterns 200, it is possible to prevent occurrence of positional displacement between the semiconductor chip 130 and the target object 110 during sintering due to a difference in coefficients of thermal expansion between the semiconductor chip 130 and the target object 110, or the like. A contact area between the semiconductor chip 130 and the target object 110 to be joined may be substantially the same or may be different between the metal paste pattern 200 positioned in an edge portion of the joining region and the metal paste pattern 800 positioned in the central part of the joining region.

Figure 9:
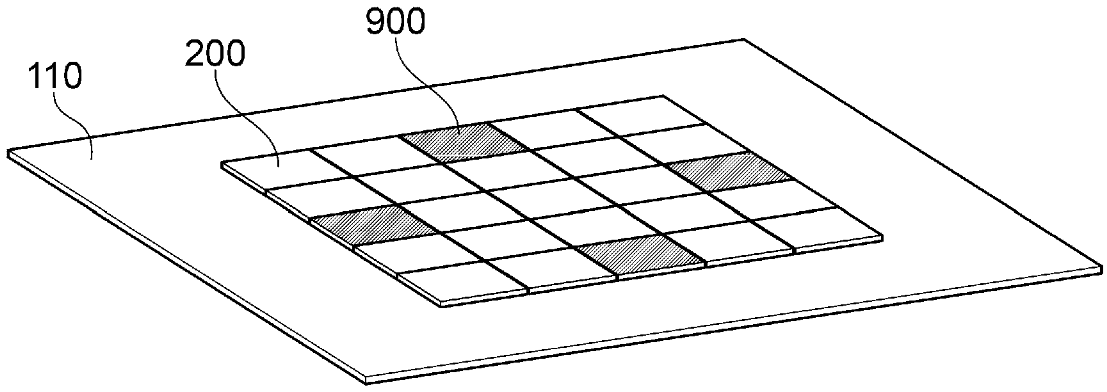
FIG. 9 illustrates a fourth modification example of the metal paste pattern 200 according to the present embodiment.

FIG. 9 illustrates a fourth modification example of the metal paste pattern 200 according to the present embodiment. In the present drawing, two metal paste patterns 900 positioned in two edge portions at positions opposing to each other in a joining region are made of pastes having different sintering conditions (temperature, time, and the like) from those of at least one metal paste pattern 200 not positioned in an edge portion of the joining region. For example, the metal paste pattern 200 not positioned in an edge portion of the joining region may be made of a Cu paste, and the metal paste patterns 900 positioned in edge portions of the joining region may be made of an Ag paste. Alternatively, the metal paste pattern 200 not positioned in an edge portion of the joining region and the metal paste patterns 900 positioned in edge portions of the joining region may use Cu pastes having different characteristics from each other. In the sintering illustrated in FIG. 4B and the like, the metal paste patterns 900 positioned in edge portions of the joining region may be sintered faster as compared to at least one metal paste pattern 200 not positioned in an edge portion of the joining region. In this way, since an overlapping position with respect to the semiconductor chip 130 in the target object 110 can be temporarily fixed at an earlier point with the metal paste patterns 900, and then the semiconductor chip 130 and the target object 110 can be joined with other metal paste patterns 200, it is possible to prevent occurrence of positional displacement between the semiconductor chip 130 and the target object 110 during sintering due to a difference in coefficients of thermal expansion between the semiconductor chip 130 and the target object 110, or the like. A contact area between the semiconductor chip 130 and the target object 110 to be joined may be substantially the same or may be different between the metal paste patterns 900 positioned in edge portions of the joining region and the metal paste pattern 200 not positioned in an edge portion of the joining region.

In addition, in the example of the present drawing, the metal paste patterns 900 are arranged one each in the center of each of two edge portions positioned opposingly to each other in the joining region. However, alternatively, the metal paste patterns 900 may be arranged one each at opposing corners of the joining region. In the example of the present drawing, there are two metal paste patterns 900, however, the metal paste patterns 900 may be provided more than two. For example, in the joining region having a quadrangular shape, four metal paste patterns 900 may be arranged one each at the center of each edge portion, or may be arranged one each at each vertex.

FIG. 6 to FIG. 9 illustrated the modification examples in which the metal paste pattern 200 is varied in accordance with a position within one joining region. However, instead of this, the metal paste pattern 200 may be varied in accordance with a position on the target object 110. In FIG. 2B, in the plurality of metal paste patterns 200 which join the semiconductor chip 130 positioned in a circumferential edge among the plurality of semiconductor chips 130 which should be joined to the target object 110, at least one metal paste pattern 200 may have a smaller contact area with respect to the semiconductor chip 130 and the target object 110 to be joined, as compared to at least one another metal paste pattern 200. In this case, the plurality of metal paste patterns 200 to be joined to the semiconductor chip 130 not positioned in the circumferential edge portion may have substantially the same contact area with respect to the semiconductor chip 130 and the target object 110 to be joined.

FIG. 3 to FIG. 4 illustrated the method of joining only the plurality of semiconductor chips 130 to the target object 110. Alternatively, a temporarily holding chip may be arranged instead of the semiconductor chip 130, in a circumferential edge of the supporting substrate 320 illustrated in FIG. 3B. The temporarily holding chip may be formed of silicon. At least one metal paste pattern 200 among the plurality of metal paste patterns 200 which join the temporarily holding chip and the target object 110 in a later process may have a smaller contact area with respect to the temporarily holding chip or the semiconductor chip 130 and the target object 110 to be joined, as compared to at least one metal paste pattern 200 among the plurality of metal paste patterns 200 which join the semiconductor chip 130 and the target object 110. In this case, the plurality of metal paste patterns 200 to be joined to the semiconductor chip 130 may have substantially the same contact area with respect to the semiconductor chip 130 and the target object 110 to be joined.

Figure 10A:
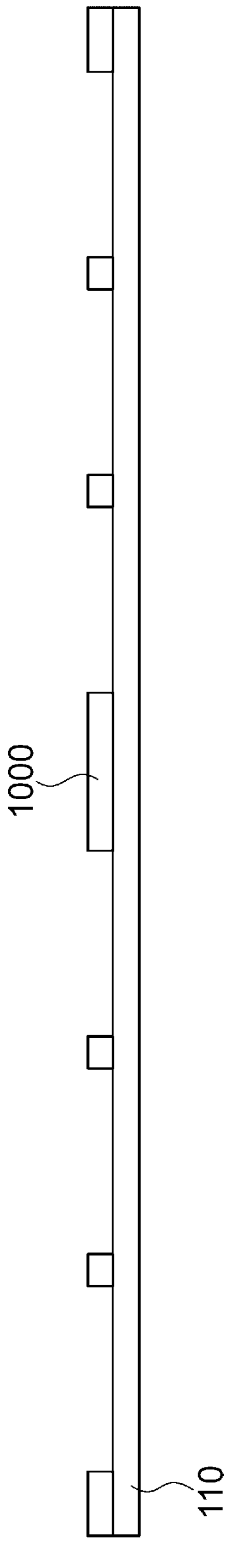
FIG. 10A illustrates arranging a stencil 1000 on the target object 110, in a formation method of the metal paste pattern 200 according to the present embodiment.
Figure 10B:
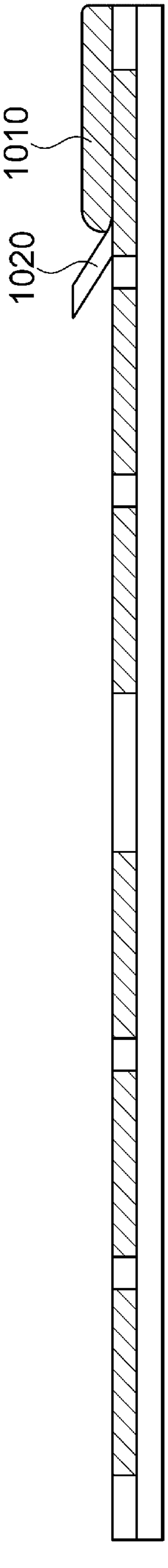
FIG. 10B illustrates forming the metal paste pattern 200 on the target object 110 by using the stencil 1000, in the formation method of the metal paste pattern 200 according to the present embodiment.
Figure 10C:
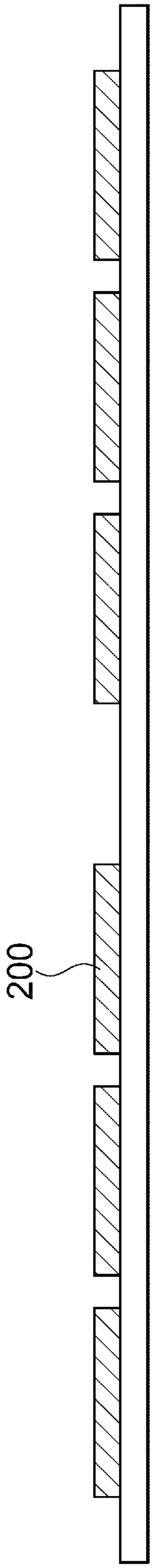
FIG. 10C illustrates removing the stencil 1000, in the formation method of the metal paste pattern 200 according to the present embodiment.

FIG. 10A to FIG. 10C illustrate a method of forming the metal paste pattern 200 by using a stencil 1000, in the forming the metal paste pattern 200 of FIG. 2B and the like. FIG. 10A illustrates arranging the stencil 1000 on the target object 110, in the formation method of the metal paste pattern 200 according to the present embodiment. In this process, the stencil 1000 is overlappingly arranged on the target object 110. The stencil 1000 may be formed of metal such as stainless or aluminum. The stencil 1000 is a thin plate having a through hole in accordance with a shape of the metal paste pattern 200 intended to be formed. The stencil 1000 has approximately the same thickness as a thickness of the metal paste pattern 200 intended to be formed.

FIG. 10B illustrates forming the metal paste pattern 200 on the target object 110 by using the stencil 1000, in the formation method of the metal paste pattern 200 according to the present embodiment. In this process, the metal paste pattern 200 is formed on the target object 110 by spreading a metal paste 1010 on a surface of the target object 110 where the stencil 1000 is overlapped. In this process, the metal paste 1010 may be spread with a thin plate 1020 as a squeegee. Here, in order to suppress consumption of the metal paste 1010, the metal paste 1010 may be spread thereon by using an amount close to a final coating amount of the metal paste pattern 200.

FIG. 10C illustrates removing the stencil 1000, in the formation method of the metal paste pattern 200 according to the present embodiment. By removing the stencil 1000 from the target object 110 in this process, the metal paste pattern 200 in accordance with the stencil 1000 is formed on the target object 110. Pre-baking treatment of the metal paste pattern 200 may be performed before the process of joining the semiconductor chip 130 and the target object 110 illustrated in FIG. 4A to FIG. 4B. The pre-baking treatment may be performed for 10 minutes at 80° C.

Figure 11:
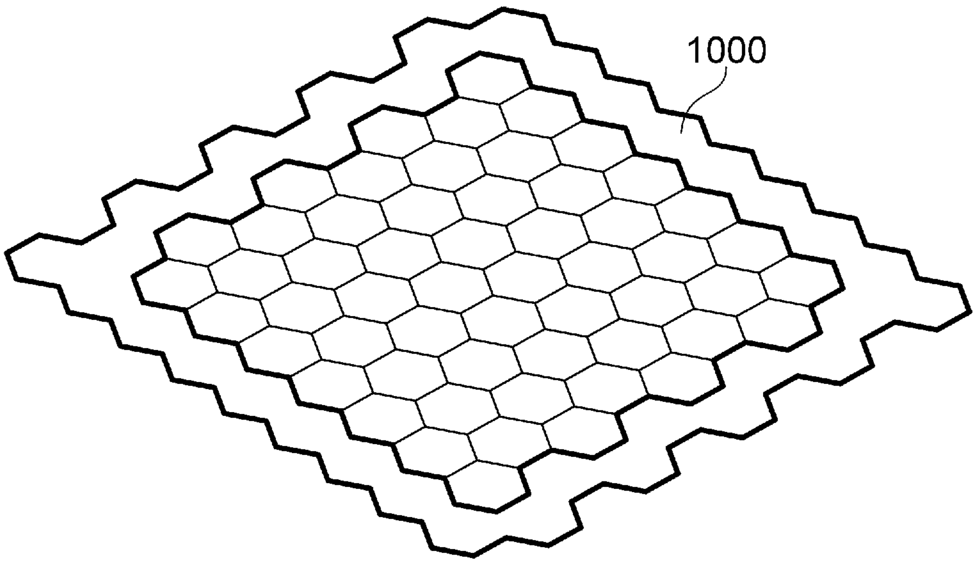
FIG. 11 illustrates an example of the stencil 1000.

FIG. 11 illustrates an example of the stencil 1000. In the present drawing, the stencil 1000 has a honeycomb structure in which a through hole of a regular hexagonal shape where a distance between opposing vertexes is about 3.7 mm is regularly placed at an interval of about 100 μm. The stencil 1000 may have a thickness of 20 to 100 μm. Chamfering of a cross section may be performed on the stencil 1000 so as to smoothly perform the process of spreading the metal paste 1010 with the thin plate 1020 illustrated in FIG. 10B.

Figure 12A:
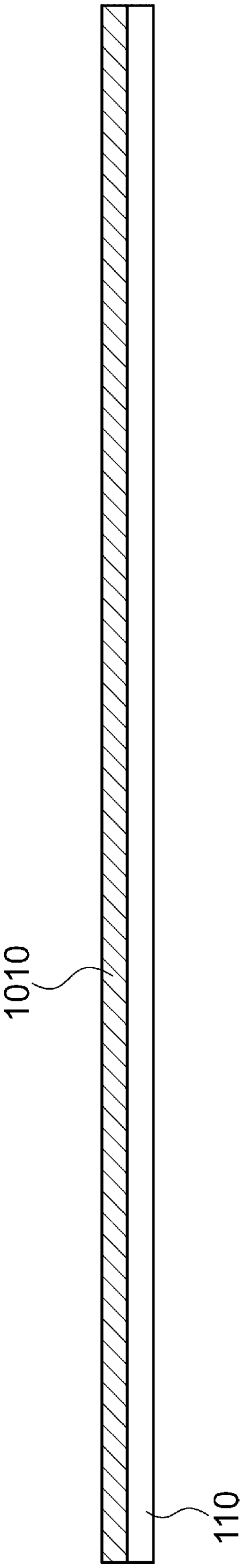
FIG. 12A illustrates arranging a layer of a metal paste 1010 on the target object 110, in a first modification example of the formation method of the metal paste pattern 200 according to the present embodiment.
Figure 12B:
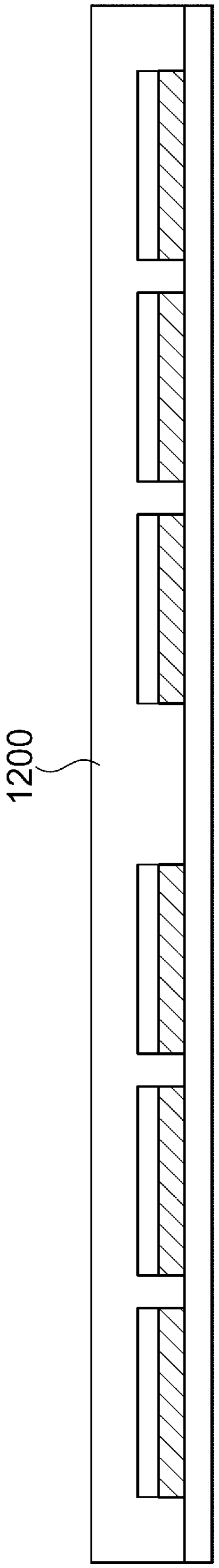
FIG. 12B illustrates pressing an imprint mask 1200 against the target object 110 where the layer of the metal paste 1010 is formed, in the first modification example of the formation method of the metal paste pattern 200 according to the present embodiment.
Figure 12C:
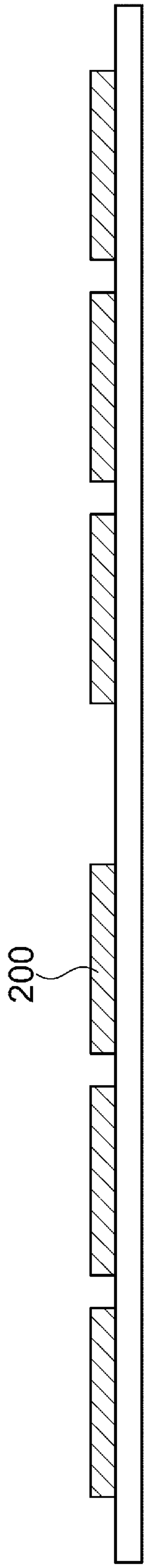
FIG. 12C illustrates removing the imprint mask 1200, in the first modification example of the formation method of the metal paste pattern 200 according to the present embodiment.

FIG. 12A to FIG. 12C illustrate the method of forming the metal paste pattern 200 by using an imprint mask 1200, in the forming the metal paste pattern 200 of FIG. 2B and the like. FIG. 12A illustrates arranging a layer of the metal paste 1010 on the target object 110, in a first modification example of the formation method of the metal paste pattern 200 according to the present embodiment. In this process, on the front surface of the target object 110, the metal paste 1010 is arranged by a broader area than individual metal paste pattern 200 by coating or the like. The metal paste 1010 may be formed thinner than a thickness of the metal paste pattern 200 intended to be formed. This is because, when the imprint mask 1200 is pressed in a later process, the metal paste 1010 positioned in a convex part of the imprint mask 1200 moves to a concave part of the imprint mask 1200, and thus the thickness of the metal paste pattern 200 to be formed becomes greater than the thickness of the metal paste 1010.

FIG. 12B illustrates pressing the imprint mask 1200 against the target object 110 where the layer of the metal paste 1010 is formed, in the first modification example of the formation method of the metal paste pattern 200 according to the present embodiment. In this process, the imprint mask 1200 is pressed against the front surface of the target object 110 where the layer of the metal paste 1010 is arranged. The imprint mask 1200 may be formed of metal such as stainless or aluminum. The imprint mask 1200 is a plate having concavity and convexity in accordance with the shape of the metal paste pattern 200 intended to be formed.

FIG. 12C illustrates removing the imprint mask 1200, in the first modification example of the formation method of the metal paste pattern 200 according to the present embodiment. In this process, by removing the imprint mask 1200 from the target object 110, the metal paste pattern 200 in accordance with the imprint mask 1200 is formed on the target object 110.

Figure 13:
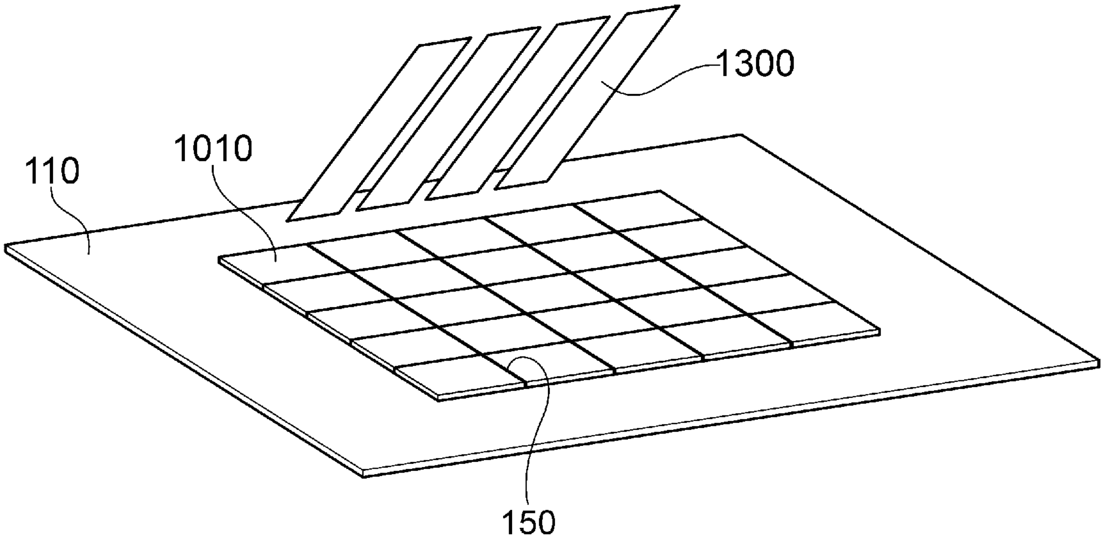
FIG. 13 illustrates a second modification example of the formation method of the metal paste pattern 200 according to the present embodiment.

FIG. 13 illustrates a second modification example of the formation method of the metal paste pattern 200 according to the present embodiment. In the present drawing, the plurality of metal paste patterns 200 is formed by scribing the metal paste 1010 arranged on the target object 110 with a scriber 1300, thereby dividing the metal paste 1010 into a plurality of regions where the gap 150 exists between one another.

Note that the formation method of the metal paste pattern 200 may be direct coating by an inkjet technique. At this time, the metal paste pattern 200 is directly formed on the target object 110 without using the stencil 1000, the imprint mask 1200, or the like.

Figure 14A:
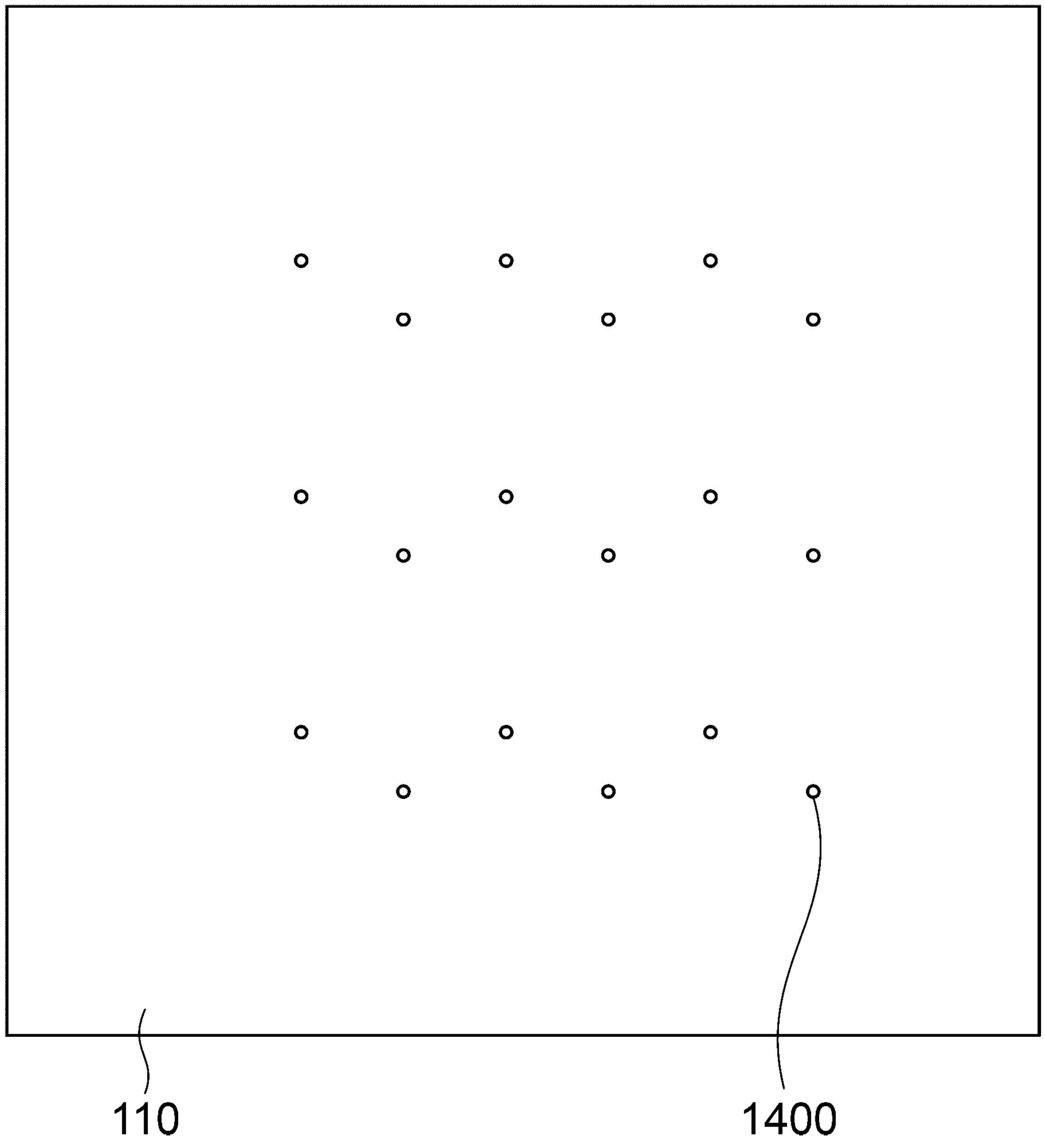
FIG. 14A illustrates an example of the target object 110 having a through hole 1400, according to a modification example of the present embodiment.

FIG. 14A illustrates an example of the target object 110 having a through hole 1400, according to a modification example of the present embodiment. The semiconductor apparatus 100 may be achieved by using the target object 110 illustrated in the present drawing. The target object 110 illustrated in the present drawing has a plurality of the through holes 1400 which is arranged regularly or irregularly. Each of the plurality of through holes 1400 is provided at a position corresponding to a gap of the metal paste pattern 200 which should be formed on the target object 110. A size of each of the plurality of through holes 1400 may be approximately the same as the gap 150 between the plurality of metal paste patterns 200 to be formed later, or may be smaller than the gap 150. Each of the plurality of through holes 1400 may be substantially the same size, or at least one through hole 1400 may have a size different from other through holes 1400.

Figure 14B:
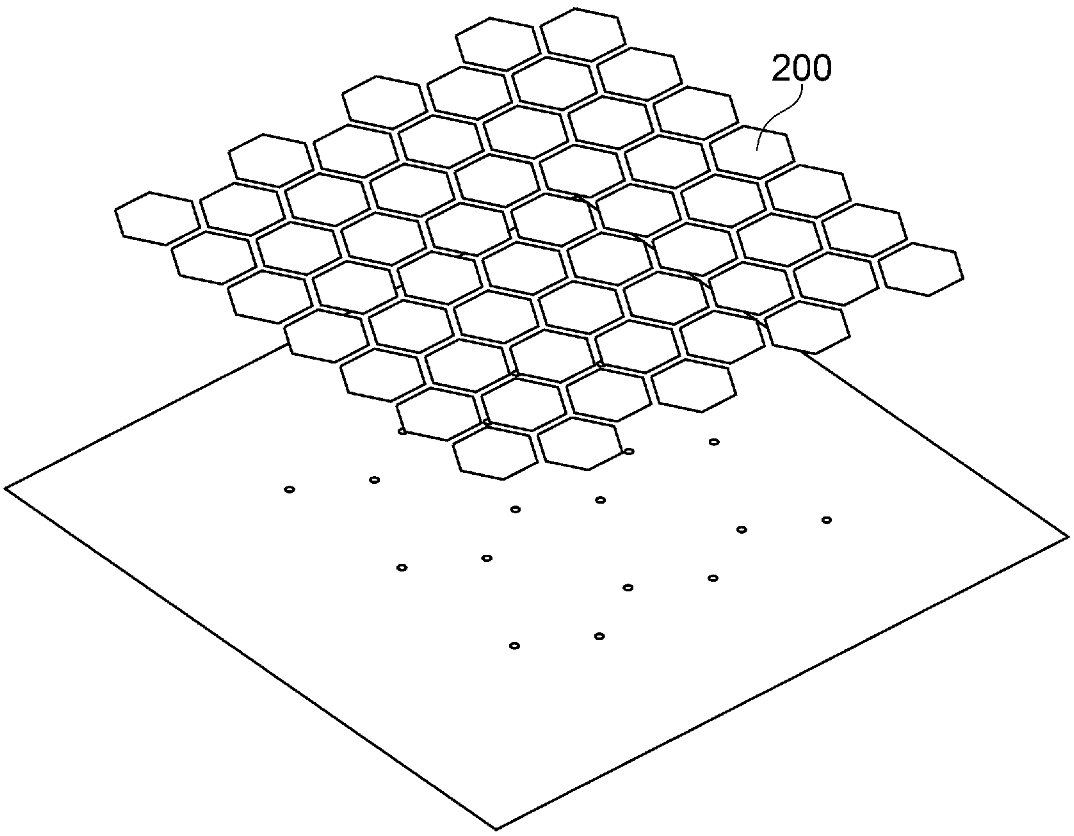
FIG. 14B illustrates a process of forming the metal paste pattern 200 in the target object 110 having the through hole 1400, according to the modification example of the present embodiment.

FIG. 14B illustrates a process of forming the metal paste pattern 200 in the target object 110 having the through hole 1400, according to the modification example of the present embodiment. In the present drawing, the metal paste pattern 200 is formed so as not to overlap with the through hole 1400. In this way, the through hole 1400 is provided at a position corresponding to the gap 150 between the plurality of metal paste patterns 200, in the target object 110.

Figure 14C:
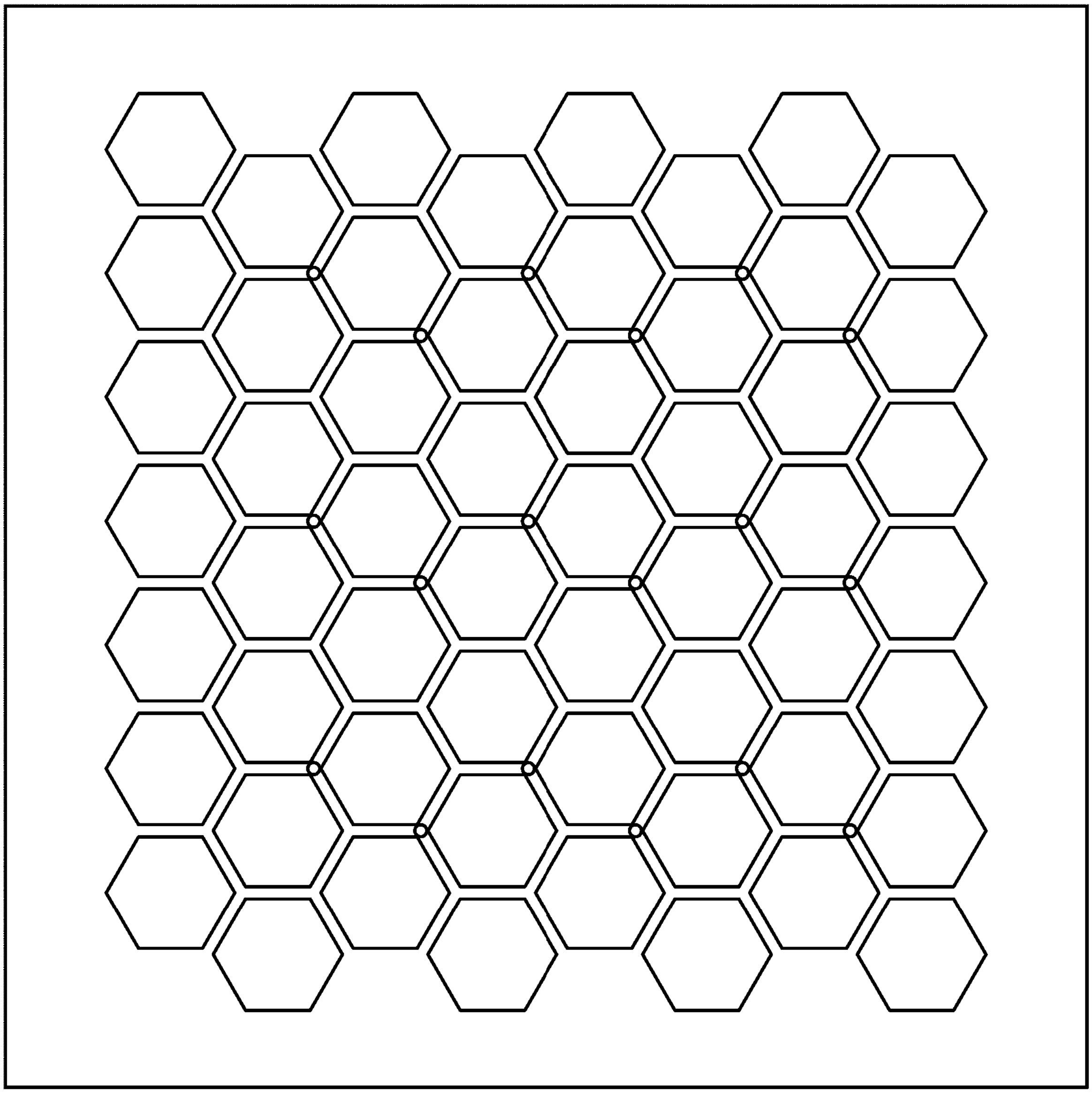
FIG. 14C illustrates the target object 110 where the metal paste pattern 200 is formed, according to the modification example of the present embodiment.

FIG. 14C illustrates the target object 110 where the metal paste pattern 200 is formed, according to the modification example of the present embodiment. When the semiconductor chip 130 is overlapped via the metal paste pattern 200 on such target object 110 and sintering treatment is performed as illustrated in FIG. 4B, at least a part of gas generated from the plurality of metal paste patterns 200 by heating goes out from the surface on the opposite side of the semiconductor chip 130 in the target object 110 through the through hole 1400, and thus degassing can be efficiently performed. Note that the target object 110 after the sintering treatment has at least one through hole 1400 at a position corresponding to the gap 150 between the plurality of sintered metal patterns 145.

Figure 15A:
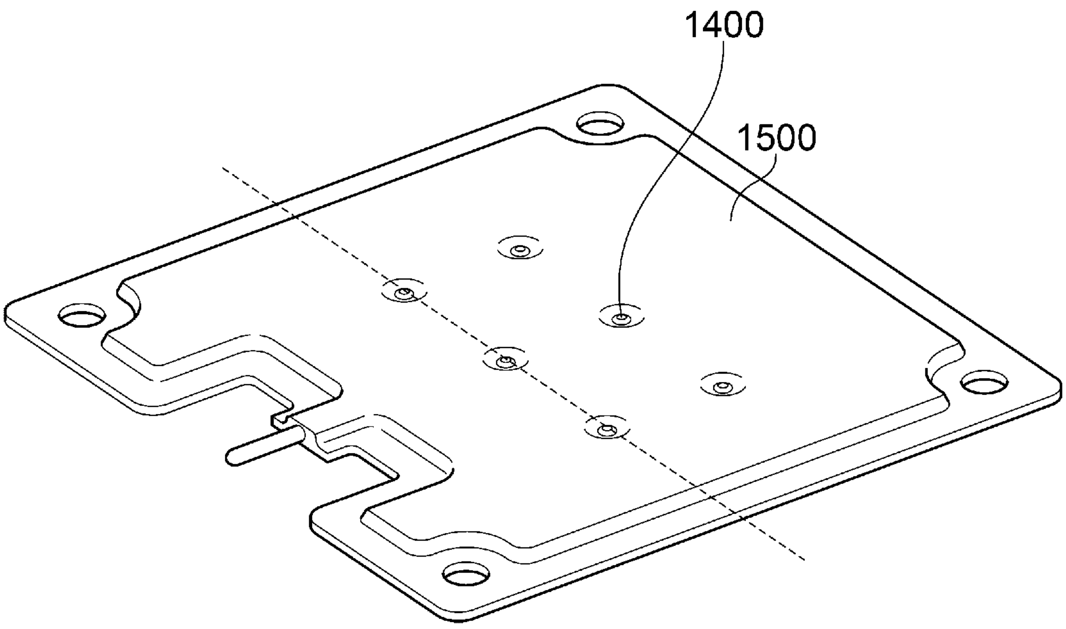
FIG. 15A illustrates a perspective view of a vapor chamber 1500 according to a modification example of the present embodiment.

FIG. 15A illustrates a perspective view of a vapor chamber 1500 according to a modification example of the present embodiment. Instead of the plate-like target object 110 as illustrated in FIG. 1, the semiconductor apparatus 100 may use the vapor chamber 1500 as the target object 110. The vapor chamber 1500 may be formed of a material having relatively high heat conductivity such as copper or aluminum. The vapor chamber 1500 has a hollow structure, and it has coolant fluid inside. The inside of the vapor chamber 1500 may be a vacuum state. The vapor chamber 1500 may have a groove on an inner wall. The vapor chamber 1500 has at least one through hole 1400. In the present drawing, the through hole 1400 may be 100 μm or smaller. Note that, when using the vapor chamber 1500 as the target object 110, after a heating process which is required in the manufacturing of the semiconductor apparatus 100, the vapor chamber 1500 can be prevented from being ruptured in the heating process by injecting coolant fluid into the inside of the vapor chamber 1500 and sealing the vapor chamber 1500.

Figure 15B:
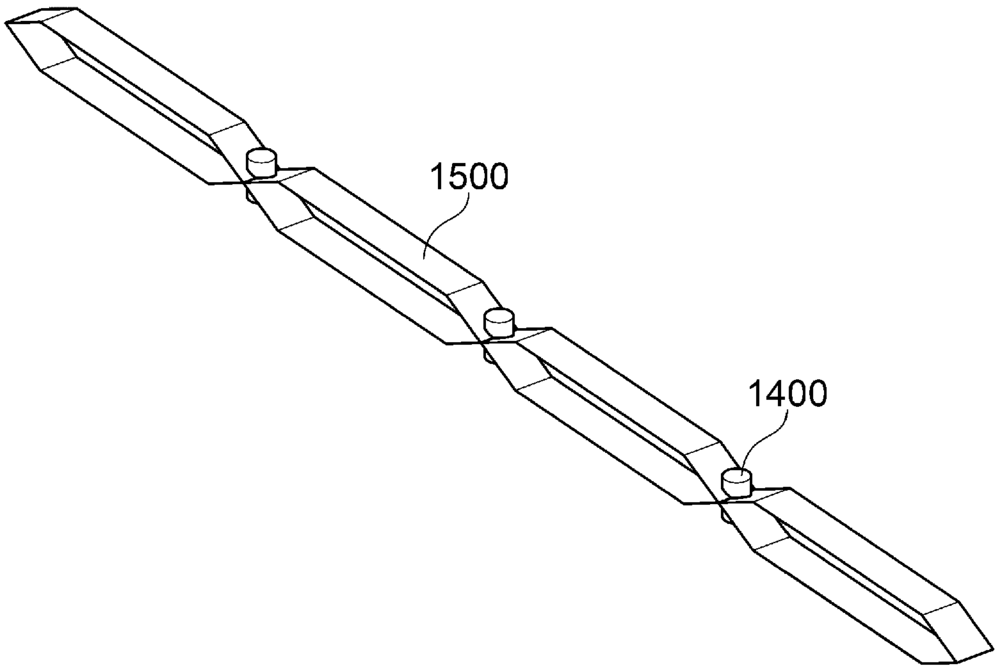
FIG. 15B illustrates a cross-sectional view of the vapor chamber 1500 according to the modification example of the present embodiment.

FIG. 15B illustrates a cross-sectional view of the vapor chamber 1500 according to the modification example of the present embodiment. The present drawing is a cross-sectional view when cutting is performed at a dotted line of FIG. 15A. As in the present drawing, at least one through hole 1400 is isolated from an internal space of the vapor chamber 1500. By providing such at least one through hole 1400, it is possible to perform degassing through the through hole 1400 at the time of joining the semiconductor chip 130, while maintaining airtightness of the vapor chamber 1500.

While the present invention has been described by way of the embodiments, the technical scope of the present invention is not limited to the scope described in the above-described embodiments. It is apparent to persons skilled in the art that various alterations or improvements can be made to the above-described embodiments. It is also apparent from the description of the claims that the embodiments to which such alterations or improvements are made can be included in the technical scope of the present invention.

The operations, procedures, steps, and stages of each process performed by a device, system, program, and method shown in the claims, specification, or drawings can be performed in any order as long as the order is not indicated by "prior to," "before," or the like and as long as the output from a previous process is not used in a later process. Even if the process flow is described using phrases such as "first" or "next" in the claims, specification, or drawings, it does not necessarily mean that the process must be performed in this order.

EXPLANATION OF REFERENCES

100 semiconductor apparatus, 110 target object, 120 supporting substrate, 130 semiconductor chip, 132 circuit pattern, 140 joining member, 145 sintered metal pattern, 150 gap, 200 metal paste pattern, 300 film frame, 302 frame, 304 film, 310 picker, 320 supporting substrate, 500 target object, 600 metal paste pattern, 700 metal paste pattern, 800 metal paste pattern, 900 metal paste pattern, 1000 stencil, 1010 metal paste, 1020 thin plate, 1200 imprint mask, 1300 scriber, 1400 through hole, 1500 vapor chamber.

What is claimed is:

1. A manufacturing method of a semiconductor apparatus in which a semiconductor chip is joined to a target object, comprising:

forming, in a joining region between the semiconductor chip and the target object where the semiconductor chip and the target object should be joined to each other, a plurality of metal paste patterns, wherein each of the plurality of metal paste patterns has a thickness, wherein there is a gap between each of the plurality of metal paste patterns and its every neighboring metal paste pattern of the plurality of metal paste patterns, wherein the gap extends for at least a part of the thickness of each of the plurality of metal paste patterns along a thickness direction; and joining the semiconductor chip and the target object by sintering the plurality of metal paste patterns sandwiched between the semiconductor chip and the target object in a state where the gap exists between each of the plurality of metal paste patterns and its every neighboring metal paste pattern of the plurality of metal paste patterns, wherein the gap between the plurality of metal paste patterns is 0.5 times or greater and 100 times or smaller of a thickness of each of the plurality of metal paste patterns.

2. A manufacturing method of a semiconductor apparatus in which a semiconductor chip is joined to a target object, comprising:

forming, in a joining region between the semiconductor chip and the target object where the semiconductor chip and the target object should be joined to each other, a plurality of metal paste patterns, wherein each of the plurality of metal paste patterns has a thickness, wherein there is a gap between each of the plurality of metal paste patterns and its every neighboring metal paste pattern of the plurality of metal paste patterns, wherein the gap extends for at least a part of the thickness of each of the plurality of metal paste patterns along a thickness direction; and joining the semiconductor chip and the target object by sintering the plurality of metal paste patterns sandwiched between the semiconductor chip and the target object in a state where the gap exists between each of the plurality of metal paste patterns and its every neighboring metal paste pattern of the plurality of metal paste patterns, wherein at least one metal paste pattern among the plurality of metal paste patterns has a smaller contact area with respect to the semiconductor chip and the target object as compared to at least one another metal paste pattern.

3. The manufacturing method according to claim 2, wherein, among the plurality of metal paste patterns, at least one metal paste pattern positioned in an edge portion of the joining region has a smaller contact area with respect to the semiconductor chip and the target object as compared to other metal paste patterns not positioned in an edge portion of the joining region.

4. The manufacturing method according to claim 3, wherein, among the plurality of metal paste patterns, two metal paste patterns positioned in two edge portions at positions opposing to each other in the joining region have smaller contact areas with respect to the semiconductor chip and the target object as compared to other metal paste patterns not positioned in an edge portion of the joining region.

5. The manufacturing method according to claim 2, wherein, among the plurality of metal paste patterns, a metal paste pattern positioned in a central part of the joining region has a smaller contact area with respect to the semiconductor chip and the target object as compared to at least one metal paste pattern positioned in an edge portion of the joining region.

6. A manufacturing method of a semiconductor apparatus in which a semiconductor chip is joined to a target object, comprising:

forming, in a joining region between the semiconductor chip and the target object where the semiconductor chip and the target object should be joined to each other, a plurality of metal paste patterns, wherein each of the plurality of metal paste patterns has a thickness, wherein there is a gap between each of the plurality of metal paste patterns and its every neighboring metal paste pattern of the plurality of metal paste patterns, wherein the gap extends for at least a part of the thickness of each of the plurality of metal paste patterns along a thickness direction; and joining the semiconductor chip and the target object by sintering the plurality of metal paste patterns sandwiched between the semiconductor chip and the target object in a state where the gap exists between each of the plurality of metal paste patterns and its every neighboring metal paste pattern of the plurality of metal paste patterns, wherein the semiconductor chip includes a plurality of semiconductor chips, the joining region includes a plurality of joining regions, and the semiconductor apparatus includes a plurality of semiconductor apparatuses, a metal plate which is the target object to be joined with the plurality of semiconductor chips is prepared, in the forming the plurality of metal paste patterns, the plurality of metal paste patterns is formed with the gap being provided between each of the plurality of metal paste patterns and its every neighboring metal paste pattern of the plurality of metal paste patterns in each of the plurality of joining regions, which should be joined to each of the plurality of semiconductor chips, on the metal plate, in the joining the semiconductor chip and the target object, each of the plurality of semiconductor chips and the metal plate are joined by sintering the plurality of metal paste patterns sandwiched between each of the plurality of semiconductor chips and the metal plate, and the plurality of semiconductor apparatuses is singulated by cutting the metal plate, to which the plurality of semiconductor chips are joined, at between the plurality of semiconductor chips.

7. The manufacturing method according to claim 6, wherein the plurality of semiconductor chips is arranged on a supporting substrate with an interval being provided from one another, in the joining the semiconductor chip and the target object, the plurality of semiconductor chips arranged on the supporting substrate and the metal plate are joined, and the supporting substrate is delaminated from the plurality of semiconductor chips joined to the metal plate.

8. The manufacturing method according to claim 6, wherein, in the plurality of metal paste patterns which join a semiconductor chip positioned in a circumferential edge among the plurality of semiconductor chips which should be joined to the metal plate, at least one metal paste pattern has a smaller contact area with respect to the semiconductor chip and the metal plate to be joined as compared to at least one another metal paste pattern.

9. A manufacturing method of a semiconductor apparatus in which a semiconductor chip is joined to a target object, comprising:

forming, in a joining region between the semiconductor chip and the target object where the semiconductor chip and the target object should be joined to each other, a plurality of metal paste patterns, wherein each of the plurality of metal paste patterns has a thickness, wherein there is a gap between each of the plurality of metal paste patterns and its every neighboring metal paste pattern of the plurality of metal paste patterns, wherein the gap extends for at least a part of the thickness of each of the plurality of metal paste patterns along a thickness direction; and joining the semiconductor chip and the target object by sintering the plurality of metal paste patterns sandwiched between the semiconductor chip and the target object in a state where the gap exists between each of the plurality of metal paste patterns and its every neighboring metal paste pattern of the plurality of metal paste patterns, wherein the target object has at least one through hole at a position corresponding to the gap between each of the plurality of metal paste patterns and its every neighboring metal paste pattern of the plurality of metal paste patterns.

10. The manufacturing method according to claim 9, wherein the target object is a vapor chamber, and the at least one through hole is isolated from an internal space of the vapor chamber.

11. A manufacturing method of a semiconductor apparatus in which a semiconductor chip is joined to a target object, comprising:

forming, in a joining region between the semiconductor chip and the target object where the semiconductor chip and the target object should be joined to each other, a plurality of metal paste patterns, wherein each of the plurality of metal paste patterns has a thickness, wherein there is a gap between each of the plurality of metal paste patterns and its every neighboring metal paste pattern of the plurality of metal paste patterns, wherein the gap extends for at least a part of the thickness of each of the plurality of metal paste patterns along a thickness direction; and joining the semiconductor chip and the target object by sintering the plurality of metal paste patterns sandwiched between the semiconductor chip and the target object in a state where the gap exists between each of the plurality of metal paste patterns and its every neighboring metal paste pattern of the plurality of metal paste patterns, wherein the semiconductor chip comprises a chip substrate and a circuit pattern formed on one surface of the chip substrate, and the target object is joined to a surface on an opposite side of the surface where the circuit pattern is formed in the chip substrate, in the semiconductor chip.

12. A manufacturing method of a semiconductor apparatus in which a semiconductor chip is joined to a target object, comprising:

forming, in a joining region between the semiconductor chip and the target object where the semiconductor chip and the target object should be joined to each other, a plurality of metal paste patterns, wherein each of the plurality of metal paste patterns has a thickness, wherein there is a gap between each of the plurality of metal paste patterns and its every neighboring metal paste pattern of the plurality of metal paste patterns, wherein the gap extends for at least a part of the thickness of each of the plurality of metal paste patterns along a thickness direction; and joining the semiconductor chip and the target object by sintering the plurality of metal paste patterns sandwiched between the semiconductor chip and the target object in a state where the gap exists between each of the plurality of metal paste patterns and its every neighboring metal paste pattern of the plurality of metal paste patterns, wherein each of the plurality of metal paste patterns contacts the semiconductor chip and the target object by a size of 10 mm square or smaller.

* * * * *